(12) United States Patent
Belk

(10) Patent No.: US 8,704,615 B2
(45) Date of Patent: *Apr. 22, 2014

(54) INTEGRATED CHANNEL FILTER AND METHOD OF OPERATION

(75) Inventor: Nathan R. Belk, Lucas, TX (US)

(73) Assignee: CSR Technology, Inc., San Jose, CA (US)

( * ) Notice: Subject to any disclaimer, the term of this patent is extended or adjusted under 35 U.S.C. 154(b) by 569 days.

This patent is subject to a terminal disclaimer.

(21) Appl. No.: 12/983,781

(22) Filed: Jan. 3, 2011

(65) Prior Publication Data

US 2011/0102104 A1    May 5, 2011

Related U.S. Application Data

(62) Division of application No. 10/694,074, filed on Oct. 27, 2003, now Pat. No. 7,884,886.

(51) Int. Cl.
*H03H 7/00* (2006.01)
*H04N 5/50* (2006.01)

(52) U.S. Cl.
USPC .......................................... 333/174; 348/731

(58) Field of Classification Search
USPC .......... 333/167, 174, 175, 205; 348/725, 731, 348/735
See application file for complete search history.

(56) References Cited

U.S. PATENT DOCUMENTS

| | | | |
|---|---|---|---|
| 4,216,451 A | 8/1980 | Nishimura et al. | |
| 4,480,338 A | 10/1984 | Dobrovolny | |
| 5,737,035 A | 4/1998 | Rotzoll | |
| 5,825,833 A | 10/1998 | Sakaue | |
| 5,898,900 A | 4/1999 | Richter et al. | |
| 5,930,696 A | 7/1999 | Tzuang et al. | |
| 6,118,499 A | 9/2000 | Fang | |
| 6,177,964 B1 | 1/2001 | Birleson et al. | |
| 6,297,858 B1 | 10/2001 | Yang | |
| 6,313,885 B1 | 11/2001 | Patel et al. | |
| 6,681,103 B1 | 1/2004 | Rogers et al. | |
| 6,784,766 B2 * | 8/2004 | Allison et al. | 333/205 |
| 6,882,245 B2 | 4/2005 | Utsunomiya et al. | |
| 6,909,470 B2 | 6/2005 | Mizukami et al. | |
| 6,925,291 B2 | 8/2005 | Pugel | |
| 6,931,083 B1 | 8/2005 | Linder et al. | |
| 7,006,162 B2 | 2/2006 | Cowley et al. | |
| 7,173,505 B2 | 2/2007 | Behzad | |
| 7,187,913 B1 | 3/2007 | Rahn et al. | |

(Continued)

FOREIGN PATENT DOCUMENTS

| | | |
|---|---|---|
| EP | 1282227 A2 | 2/2003 |
| JP | 59100613 A | 6/1984 |

OTHER PUBLICATIONS

PCT Search Report for PCT/US2004/032853, Jan. 24, 2005, 8 pages.

(Continued)

*Primary Examiner* — Dean O Takaoka
(74) *Attorney, Agent, or Firm* — Fulbright & Jaworski LLP

(57) ABSTRACT

A system includes a filter and a tuner formed on an integrated circuit. The filter receives an input signal comprising a first number of channels and communicates an intermediate output signal comprising a second number of channels less than the first number of channels. The tuner is coupled to the filter and receives the intermediate output signal and communicates an output signal comprising a third number of channels less than the second number of channels.

13 Claims, 4 Drawing Sheets

(56) References Cited

U.S. PATENT DOCUMENTS

| | | | |
|---|---|---|---|
| 7,196,737 B1 | 3/2007 | Fulga et al. | |
| 7,212,586 B2 | 5/2007 | Shi et al. | |
| 7,304,533 B2 | 12/2007 | Hisayasu et al. | |
| 7,852,146 B2 | 12/2010 | Hisayasu et al. | |
| 7,884,886 B2 * | 2/2011 | Belk | 348/731 |
| 2003/0032398 A1 | 2/2003 | Harris | |
| 2005/0024544 A1 | 2/2005 | Waight et al. | |
| 2005/0096004 A1 | 5/2005 | Tso et al. | |

OTHER PUBLICATIONS

PCT Notification of Transmittal of the International Search Report and the Written Opinion of the International Searching Authority for International Application No. PCT/US06/14349, Aug. 7, 2006, 9 pages.

* cited by examiner

INTEGRATED CHANNEL FILTER AND METHOD OF OPERATION

CROSS-REFERENCE TO RELATED APPLICATIONS

The present application is a divisional of co-pending, commonly assigned, U.S. patent application Ser. No. 10/694,074 entitled "AN INTEGRATED CHANNEL FILTER AND METHOD OF OPERATION," filed Oct. 27, 2003, the disclosure of which is hereby incorporated herein by reference.

TECHNICAL FIELD

This invention relates in general to signal processing, and more particularly to an integrated channel filter.

BACKGROUND OF THE INVENTION

The power and performance requirements for a broadband tuner are determined by the number of channels that the tuner processes. A typical broadband tuner receives and processes over one-hundred channels in order to yield the one or more channels that are desired. This results in a number of disadvantages. For example, the number of intermodulation products produced by the tuner grows as the square of the number of channels that are processed by the tuner. A tuner that processes over one-hundred channels therefore experiences significant noise. Moreover, the intermodulation products produced by a tuner that processes over one-hundred channels decreases the range of gain programmability of the tuner.

BRIEF SUMMARY OF THE INVENTION

In accordance with the present invention, the disadvantages and problems associated with prior tuners have been substantially reduced or eliminated.

In accordance with one embodiment of the present invention, a system includes a filter and a tuner formed on an integrated circuit. The filter receives an input signal comprising a first number of channels and communicates an intermediate output signal comprising a second number of channels less than the first number of channels. The tuner is coupled to the filter and receives the intermediate output signal and communicates an output signal comprising a third number of channels less than the second number of channels.

Another embodiment of the present invention is a filter for receiving an input signal comprising a first number of channels and for communicating an intermediate output signal comprising a second number of channels less than the first number of channels. The filter comprises at least one stage that comprises an inductor, a first capacitor, and a plurality of switchable capacitors. The first capacitor has a first lead and a second lead, wherein the first lead of the first capacitor is coupled to a lead of the inductor. Each of the switchable capacitors has a first lead coupled to the first lead of the first capacitor and a second lead switchably coupled to the second lead of the first capacitor.

Yet another embodiment of the present invention is a method for filtering an input signal. The method includes receiving an input signal comprising a plurality of bands of channels. The method continues by switching among a plurality of stages of a filter to communicate an intermediate output signal comprising a selected one of the plurality of bands of channels. The filter is formed on an integrated circuit. The method concludes by receiving the intermediate output signal and communicating an output signal comprising a subset of the channels from the selected band of channels.

The following technical advantages may be achieved by some, none, or all of the embodiments of the present invention.

Particular technical advantages of the present invention are achieved because the filter is formed at least in part on the integrated circuit. For example, filters that are not formed on the integrated circuit propagate the desired channels but reflect the undesired channels back to the transmitter or other source of the input signal. This reflection of undesired channels tends to corrupt all of the channels in the input signal, including the desired channels. The filter which is formed on the integrated circuit communicates the desired channels but does not reflect the undesired channels back to the transmitter or source of the input signal. Instead, the undesired channels are dissipated in various components, such as the lossy elements, of the integrated circuit. The corruption of the desired channels is therefore no longer a significant issue.

By arranging the filter before or integral to an input stage of the tuner, the circuit of the present invention achieves particular technical advantages. For example, as described above, the number of intermodulation products produced by the tuner grows as the square of the number of channels that are processed by the tuner.

Therefore, by attenuating approximately 80% of the undesired channels prior to the processing performed by the tuner, the circuit eliminates roughly 95% of the intermodulation products produced by the tuner. The range of gain programmability of the tuner is therefore increased. The reduction in intermodulation products also tends to reduce many second order intermodulation products (e.g., second order harmonic distortion). Furthermore, as described above, the power and performance requirements for the tuner are determined by the number of channels processed by the tuner. By reducing the number of channels processed by the tuner (e.g., from one-hundred-thirty-three channels to twenty-five channels in a television system) the power consumption in subsequent stages of the tuner is reduced.

These and other advantages, features, and objects of the present invention will be more readily understood in view of the following detailed description and the drawings.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

Figure 1:
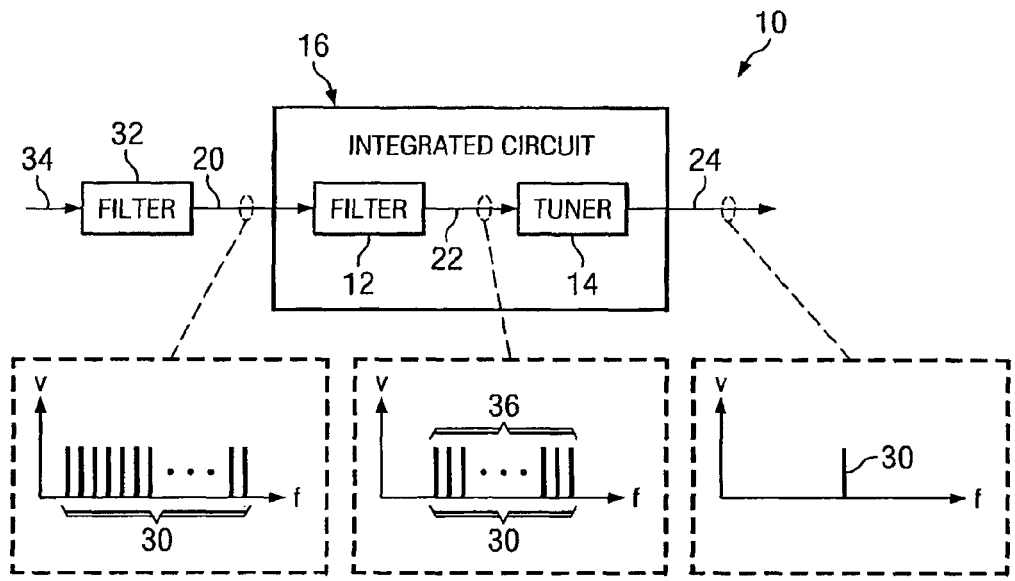
FIG. 1 illustrates one embodiment of a system that includes a filter and a tuner formed on an integrated circuit.

FIG. 1 illustrates one embodiment of a system 10 that includes a filter 12 coupled to a tuner 14. At least portions of filter 12 and tuner 14 are formed on an integrated circuit 16. In a particular embodiment associated with television systems, system 10 further comprises a front-end filter 32. In general, filter 12 receives an input signal 20 comprising a first number of channels 30. Filter 12 communicates an intermediate output signal 22 comprising a second number of channels 30 less than the first number of channels 30. Tuner 14 receives intermediate output signal 22 and communicates an output signal 24 comprising a third number of channels 30 less than the second number of channels 30. In this respect, the number of channels 30 received and processed by tuner 14 is reduced over prior techniques for performing tuning of channels 30.

Filter 12 comprises any suitable number and combination of frequency selective components that may be formed on integrated circuit 16. In a particular embodiment described in greater detail with reference to FIG. 2, filter 12 comprises a plurality of filter stages and is switchable among the plurality of stages in order to communicate an intermediate output signal 22 that comprises a selected band of channels 30. At least one of the stages of filter 12 comprises an inductor and a parallel combination of capacitors arranged in series with the inductor. At least a portion of the capacitors may be switched into or out of connection with the inductor to change the frequency selectivity of the filter 12. These and other aspects of filter 12 are explained in greater detail with reference to FIG. 2.

Particular technical advantages of system 10 are achieved because filter 12 is formed at least in part on integrated circuit 16. For example, filters that are not formed on the integrated circuit 16 propagate the desired channels 30 but reflect the undesired channels 30 back to the transmitter or other source of the input signal 20. This reflection of undesired channels 30 tends to corrupt all of the channels 30 in the input signal 20, including the desired channels 30. Filter 12 formed on integrated circuit 16 communicates desired channels 30 but does not reflect the undesired channels 30 back to the transmitter or source of input signal 20. Instead, the undesired channels 30 are dissipated in various components, such as the lossy elements, of integrated circuit 16. The corruption of the desired channels 30 is therefore no longer a significant issue. Moreover, an advantage of system 10 is that no transistor on integrated circuit 16 is required to provide a voltage gain or otherwise amplify the entire frequency spectrum of input signal 20.

Tuner 14 comprises any suitable number and combination of active and passive components including, but not limited to, variable low noise amplifiers, gain control modules, mixers, and filters that may extract content from a desired radio frequency spectrum and convert the content into a form that is useable, for example, by an access device. In one embodiment, tuner 14 comprises a television tuner for use in a television system. Although filter 12 and tuner 14 are illustrated as separate components in FIG. 1, it should be understood that in particular embodiments, filter 12 may be formed integral to tuner 14. For example, filter 12 may be formed integral to an input stage of tuner 14. By arranging filter 12 before or integral to an input stage of tuner 14, system 10 achieves particular technical advantages.

For example, as described above, the number of intermodulation products produced by the tuner 14 grows as the square of the number of channels 30 that are processed by the tuner 14. Therefore, by attenuating approximately 80% of the undesired channels 30 prior to the processing performed by tuner 14, circuit 10 eliminates roughly 95% of the intermodulation products produced by tuner 14. The range of gain programmability of tuner 14 is therefore increased. The reduction in intermodulation products also tends to reduce many second order intermodulation products (e.g., second order harmonic distortion). Furthermore, as described above, the power and performance requirements for tuner 14 are determined by the number of channels 30 processed by tuner 14. By reducing the number of channels 30 processed by tuner 14 (e.g., from one-hundred-thirty-three channels to twenty-five channels in a television system), the power consumption in subsequent stages of tuner 14 is reduced.

Input signal 20 comprises a radio frequency signal. In a television system, signals representing individual channels 30 are assigned to specific frequencies in a defined frequency band. For example, in the United States, television signals are generally transmitted in a band from 48 MHz to 852 MHz. In such television systems, front-end filter 32 comprises a low-pass filter that receives a signal 34 and is designed to significantly, attenuate all frequencies above an input cutoff frequency that is higher than the frequencies of the channels 30 in the television band. The output of front-end filter 32 is therefore input signal 20 having channels 30 in the television band.

Intermediate output signal 22 comprises a particular band 36 of channels 30 selectively communicated by filter 12. Therefore, when used in a television system, at least some of the channels 30 in the television frequency band are significantly attenuated in input signal 20 to form intermediate output signal 22. For example, input signal 20 includes one-hundred-thirty-three channels 30 and intermediate output signal 22 includes approximately twenty-five channels 30. Output signal 24 comprises, for example, one or more desired channels 30 from intermediate output signal 22. In a television system, for example, output signal 24 may comprise a single desired channel 30 in the television band.

In operation, filter 12 receives an input signal 20 comprising a first number of channels 30. Filter 12 is switched among a plurality of stages and/or capacitors of a particular stage in order to communicate an intermediate output signal 22 comprising a selected one or more of the plurality of bands of channels 30. The selected one or more of the plurality of bands of channels 30 comprises a second number of channels 30 less than the first number of channels 30. Filter 12 dissipates undesired channels 30 in lossy elements of integrated circuit 16. Tuner 14 receives intermediate output signal 22 and communicates an output signal 24 comprising a third number of channels 30 less than the second number of channels 30. In particular embodiments, the output signal 24 comprises a single channel 30 in the television band.

Figure 2:
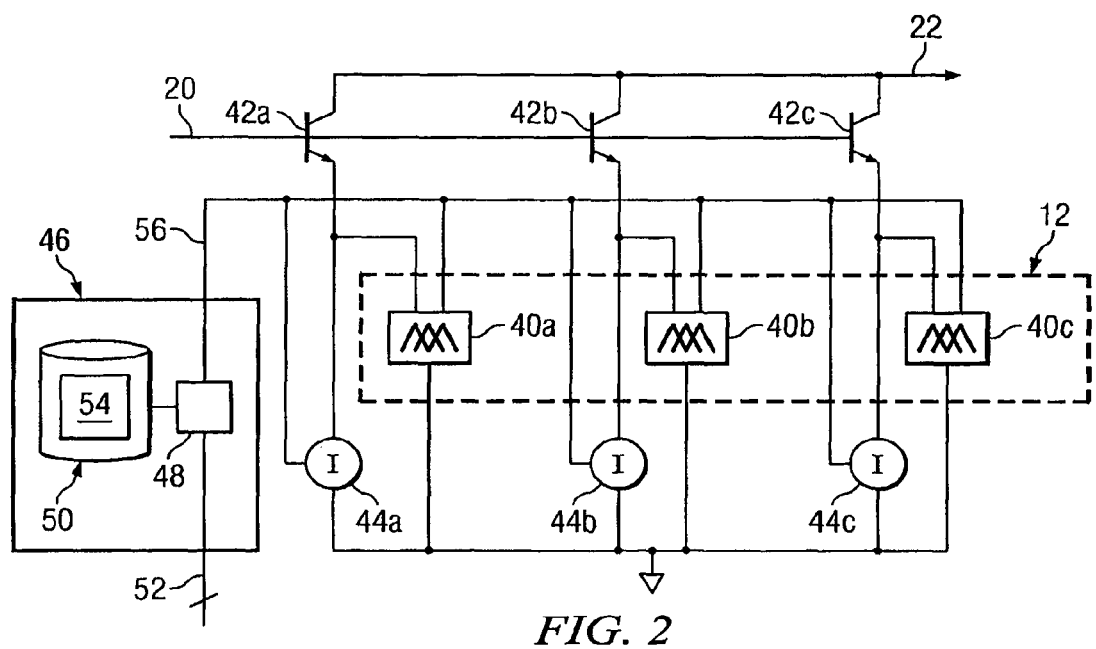
FIG. 2 illustrates one embodiment of the filter depicted in FIG. 1.

FIG. 2 illustrates a particular embodiment of circuit 10 in which filter 12 is integrated with an input stage of tuner 14 on integrated circuit 16. In this embodiment, filter 12 comprises a plurality of filter stages 40$a$, 40$b$, and 40$c$. Stages 40$a$, 40$b$, and 40$c$ are collectively referred to as stages 40 and generally referred to as a stage 40. Each stage 40 is associated with a particular range of frequency selection. For example, stage 40$a$ may be associated with frequency selection ranging from 48 MHz to 348 MHz. Stage 40$b$ may be associated with frequency selection ranging from 348 MHz to 658 MHz. Stage 40$c$ may be associated with frequency selection ranging from 658 MHz to 848 MHz. The frequency ranges are examples only and stages 40$a$-$c$ may be associated with other frequency ranges as needed or desired for particular implementations.

Although FIG. 2 illustrates filter 12 having three stages 40, it should be understood that filter 12 may be implemented using any suitable number of stages 40 to derive a desired level of granularity associated with the ranges of frequency selection. Each stage 40, as described in greater detail with reference to FIGS. 3A-3C, comprises a network of capacitors having particular values and switchably coupled to an inductor such that the range of frequency selection associated with that stage 40 may be implemented using different center frequencies.

Each stage 40 is coupled to a corresponding transistor 42. In particular, stage 40a is coupled to transistor 42a; stage 40b is coupled to transistor 42b; and stage 40c is coupled to transistor 42c. Transistors 42a, 42b, and 42c are collectively referred to as transistors 42 and generally referred to as a transistor 42. Transistors 42 may form a part of tuner 14, such as a part of the input stage of tuner 14. Each transistor 42 comprises a three terminal device. As illustrated, each transistor 42 comprises an NPN transistor having a base terminal receiving input signal 20, an emitter terminal coupled to a corresponding current source 44, and a collector terminal communicating intermediate output voltage 22. Therefore, the emitter terminal of transistor 42a is coupled to input source 44a; the emitter terminal of transistor 42b is coupled to input source 44b; and the emitter terminal of transistor 42c is coupled to input source 44c. Other types of transistors may be used without departing from the scope of the invention. Input sources 44a, 44b, and 44c are collectively referred to as input sources 44 and generally referred to as an input source 44. Each stage 40 and corresponding input source 44 is coupled to controller 46. Controller 46 may be implemented in hardware, software, firmware, or any combination thereof, and comprises a processor 48 coupled to a memory 50.

Although FIG. 2 depicts filter 12 and associated components using a single-ended implementation, it may be desirable to implement a differential architecture of filter 12 and associated components to yield a differential signal for intermediate output signal 22. A differential embodiment of filter 12 is illustrated, for example, in FIG. 5.

In operation, each of transistors 42 receives input signal 20 including all constituent channels 30 (e.g., one-hundred-thirty-three channels 30 in a television system). Depending upon which of transistors 42 are turned on using current sources 44, one of the three stages 40 is enabled. Based upon the particular stage 40 that is enabled, a particular range of frequency selection is performed upon input signal 20 to produce intermediate output signal 22. Controller 46 controls which of stages 40 is enabled and which of the capacitors associated with that stage 40 are enabled. In particular, controller 46 receives a channel selection signal 52 identifying a particular channel 30 or subset of channels 30 that are desired. Controller 46 may receive signal 52 from other components of system 10 such as, for example, components of tuner 14. Controller 46 refers to mapping information 54 stored within memory 50 using the information communicated in channel selection signal 52. Mapping information 54, described in greater detail with reference to FIG. 4, associates particular stages 40 and a particular configuration of capacitors within stages 40 with a particular range of frequency containing the desired channel 30 or channels 30. Based upon mapping information 54, controller 46 communicates a command signal 56 to enable a selected stage 40 and a particular configuration of capacitors within the selected stage 40 to implement a particular frequency selection upon input signal 20. As a result, the intermediate output signal 22 contains a fewer number of channels 30 than the original input signal 20 received by filter 12.

Figure 3A:
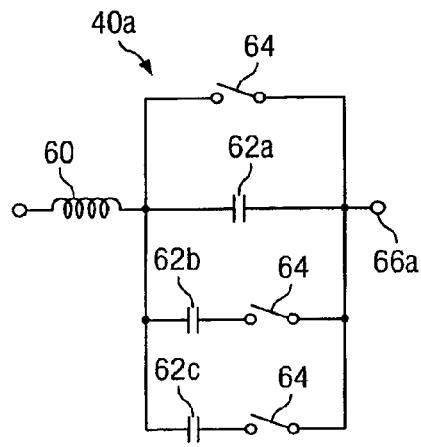
FIGS. 3A-3C illustrate embodiments of stages of the filter depicted in FIG. 1.
Figure 3B:
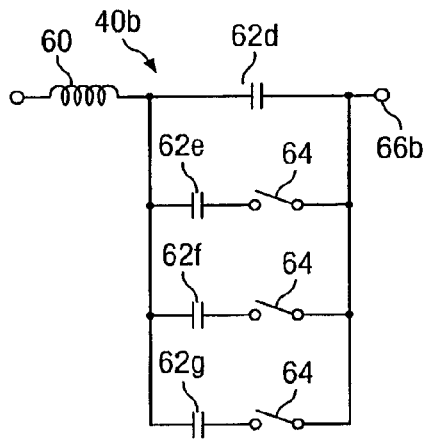
Figure 3C:
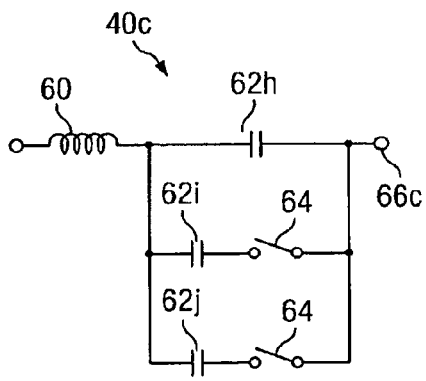

FIGS. 3A-3C illustrate particular embodiments of stages 40a-40c. Referring to FIG. 3A, stage 40a comprises an inductor 60 coupled to the emitter of transistor 42a and to a first capacitor 62a in series. A second capacitor 62b is switchably coupled in parallel to first capacitor 62a. A third capacitor 62c is switchably coupled in parallel to first capacitor 62a. Therefore, signals associated with capacitors 62b and 62c are switchably coupled to a signal associated with capacitor 62a. Capacitors 62a, 62b, and 62c may be referred to collectively as capacitors 62 and generally as a capacitor 62. Capacitors 62 each have a first terminal coupled to a terminal of inductor 60. First capacitor 62a has second terminal coupled to a terminal 66a. Terminal 66a is further coupled to ground. A first switch 64 shorts inductor 60 to terminal 66a. A second switch 64 couples the second terminal of second capacitor 62b to the second terminal of first capacitor 62a. A third switch 64 couples the second terminal of third capacitor 62c to the second terminal of first capacitor 62a. Switches 64 are selectively enabled based upon command signal 56 generated by controller 46.

Referring to FIG. 3B, stage 40b comprises an inductor 60 coupled to the emitter of transistor 42b and to a first capacitor 62d in series. A second capacitor 62e is switchably coupled in parallel to first capacitor 62d. A third capacitor 62f is switchably coupled in parallel to first capacitor 62d. A fourth capacitor 62g is switchably coupled in parallel to first capacitor 62d. Therefore, signals associated with capacitors 62e, 62f, and 62g are switchably coupled to a signal associated with capacitor 62d. Capacitors 62d, 62e, 62f, and 62g may be referred to collectively as capacitors 62 and generally as a capacitor 62. Capacitors 62 each have a first terminal coupled to a terminal of inductor 60. First capacitor 62d has a second terminal coupled to terminal 66b. Terminal 66b is further coupled to ground. A first switch 64 couples the second terminal of second capacitor 62e to the second terminal of first capacitor 62d. A second switch 64 couples the second terminal of third capacitor 62f to the second terminal of first capacitor 62d. A third switch 64 couples the second terminal of fourth capacitor 62g to the second terminal of first capacitor 62d. Switches 64 are selectively enabled based upon command signal 56 generated by controller 46.

Referring to FIG. 3C, stage 40c comprises an inductor 60 coupled to the emitter of transistor 42c and to a first capacitor 62h in series. A second capacitor 62i is switchably coupled in parallel to first capacitor 62h. A third capacitor 62j is switchably coupled in parallel to first capacitor 62h. Therefore, signals associated with capacitors 62i and 62j are switchably coupled to a signal associated with capacitor 62h. Capacitors 62h, 62i, and 62j may be referred to collectively as capacitors 62 and generally as a capacitor 62. Capacitors 62 each have a first terminal coupled to a terminal of inductor 60. First capacitor 62h has a second terminal coupled to terminal 66c. Terminal 66c is further coupled to ground. A first switch 64 couples the second terminal of second capacitor 62i to the second terminal of first capacitor 62h. A second switch 64 couples the second terminal of third capacitor 62j to the second terminal of first capacitor 62h. Switches 64 are selectively enabled based upon command signal 56 generated by controller 46.

The components of stages 40a-c of filter 12 are formed on integrated circuit 16. The values of capacitors 62 may be selected within a particular stage 40 and among stages 40 such that the appropriate combinations of capacitors 62 coupled in series with inductor 60 provide bandpass filtering about appropriate center frequencies.

Although FIGS. 3A-3B illustrate stages 40a-c having particular numbers and arrangements of capacitors 62, it should be understood that a stage 40 may have any suitable number and arrangement of capacitors 62 to derive a desired level of granularity associated with the ranges of frequency selection.

Figure 4:
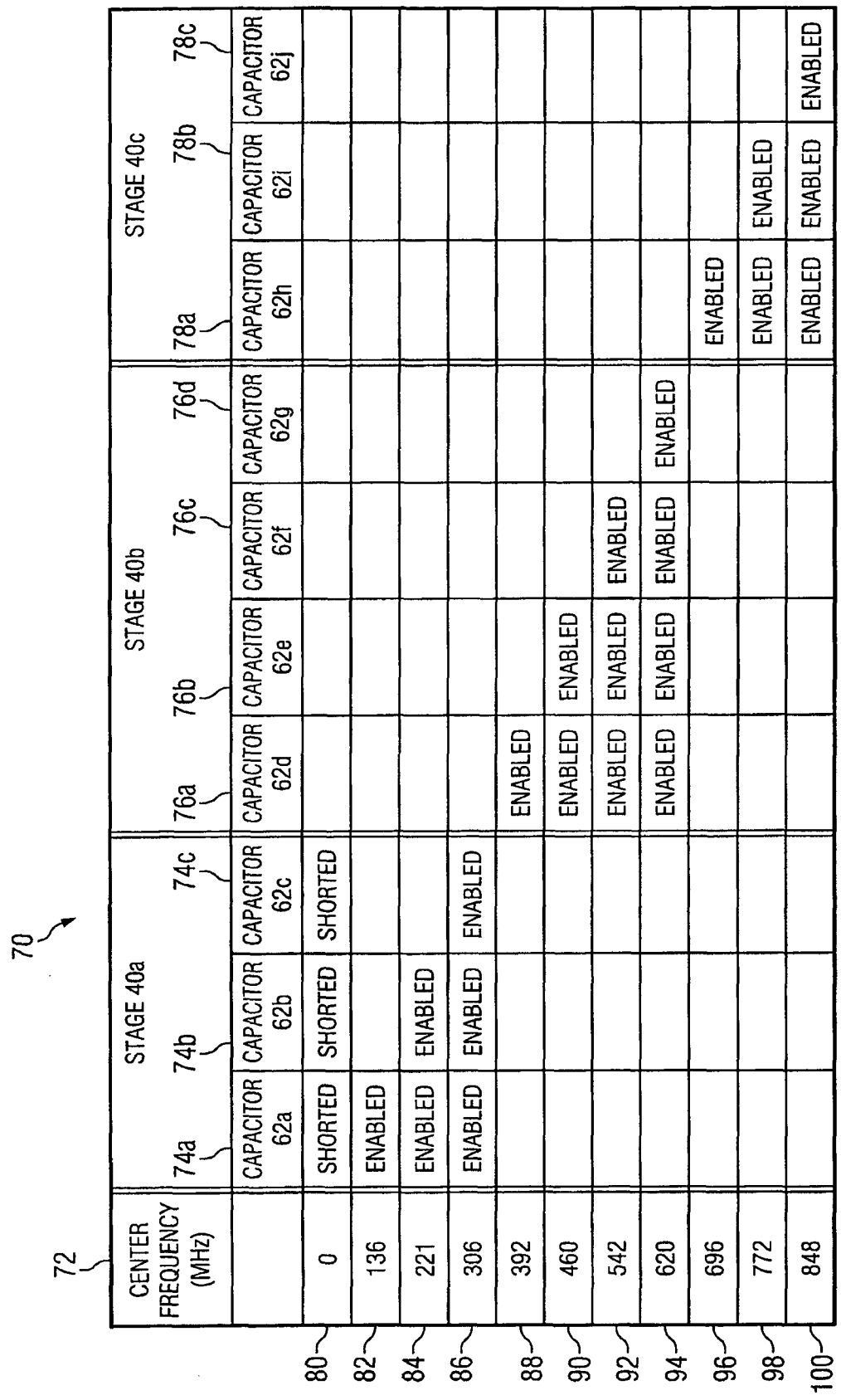
FIG. 4 illustrates mapping information used to operate the filter depicted in FIG. 1.

FIG. 4 illustrates one embodiment of table 70 that stores mapping information 54. Table 70 includes columns 72, 74a-c, 76a-d, and 78a-c. Column 72 identifies the center frequency of a particular band of channels 30. Columns 74a-c, 76a-d, and 78a-c identify which capacitors 62 of stages 40 are enabled in order to yield a frequency response for filter 12 having the center frequency identified in column 72. Example values of capacitors 62a-62j are provided herein:

Capacitor 62a 9.5 pF
Capacitor 62b 10.4 pF
Capacitor 62c 35.5 pF
Capacitor 62d 1.99 pF
Capacitor 62e 0.98 pF
Capacitor 62f 1.41 pF
Capacitor 62g 2.1 pF
Capacitor 62h 1.035 pF
Capacitor 62i 0.366 pF
Capacitor 62j=0.497 pF These values are examples only and other suitable values for capacitors 62a-j may be used as needed or desired for particular implementations.

For example, with capacitors 62a-c shorted in stage 40a, filter 12 may communicate intermediate output signal 22 having a band of channels 30 associated with a center frequency of 0 MHz, as indicated by row 80. With capacitor 62a of stage 40a coupled in series with inductor 60, filter 12 may communicate intermediate output signal 22 having a band of channels 30 associated with a center frequency of 136 MHz, as indicated by row 82. With a parallel combination of capacitors 62a and 62b of stage 40a coupled in series with inductor 60, filter 12 may communicate intermediate output signal 22 having a band of channels 30 associated with a center frequency of 221 MHz, as indicated by row 84. With a parallel combination of capacitors 62a, 62b, and 62c of stage 40a coupled in series with inductor 60, filter 12 may communicate intermediate output signal 22 having a band of channels 30 associated with a center frequency of 306 MHz, as indicated by row 86.

With capacitor 62d of stage 40b coupled in series with inductor 60, filter 12 may communicate intermediate output signal 22 having a band of channels 30 associated with a center frequency of 392 MHz, as indicated by row 88. With a parallel combination of capacitors 62d and 62e of stage 40b coupled in series with inductor 60, filter 12 may communicate intermediate output signal 22 having a band of channels 30 associated with a center frequency of 460 MHz, as indicated by row 90. With a parallel combination of capacitors 62d, 62e, and 62f of stage 40b coupled in series with inductor 60, filter 12 may communicate intermediate output signal 22 having a band of channels 30 associated with a center frequency of 542 MHz, as indicated by row 92. With a parallel combination of capacitors 62d, 62e, 62f, and 62g of stage 40b coupled in series with inductor 60, filter 12 may communicate intermediate output signal 22 having a band of channels 30 associated with a center frequency of 620 MHz, as indicated by row 94.

With capacitor 62h of stage 40c coupled in series with inductor 60, filter 12 may communicate intermediate output signal 22 having a band of channels 30 associated with a center frequency of 696 MHz, as indicated by row 96. With a parallel combination of capacitors 62h and 62i of stage 40c coupled in series with inductor 60, filter 12 may communicate intermediate output signal 22 having a band of channels 30 associated with a center frequency of 772 MHz, as indicated by row 98. With a parallel combination of capacitors 62h, 62i, and 62j of stage 40c coupled in series with inductor 60, filter 12 may communicate intermediate output signal 22 having a band of channels 30 associated with a center frequency of 848 MHz, as indicated by row 100.

Figure 5:
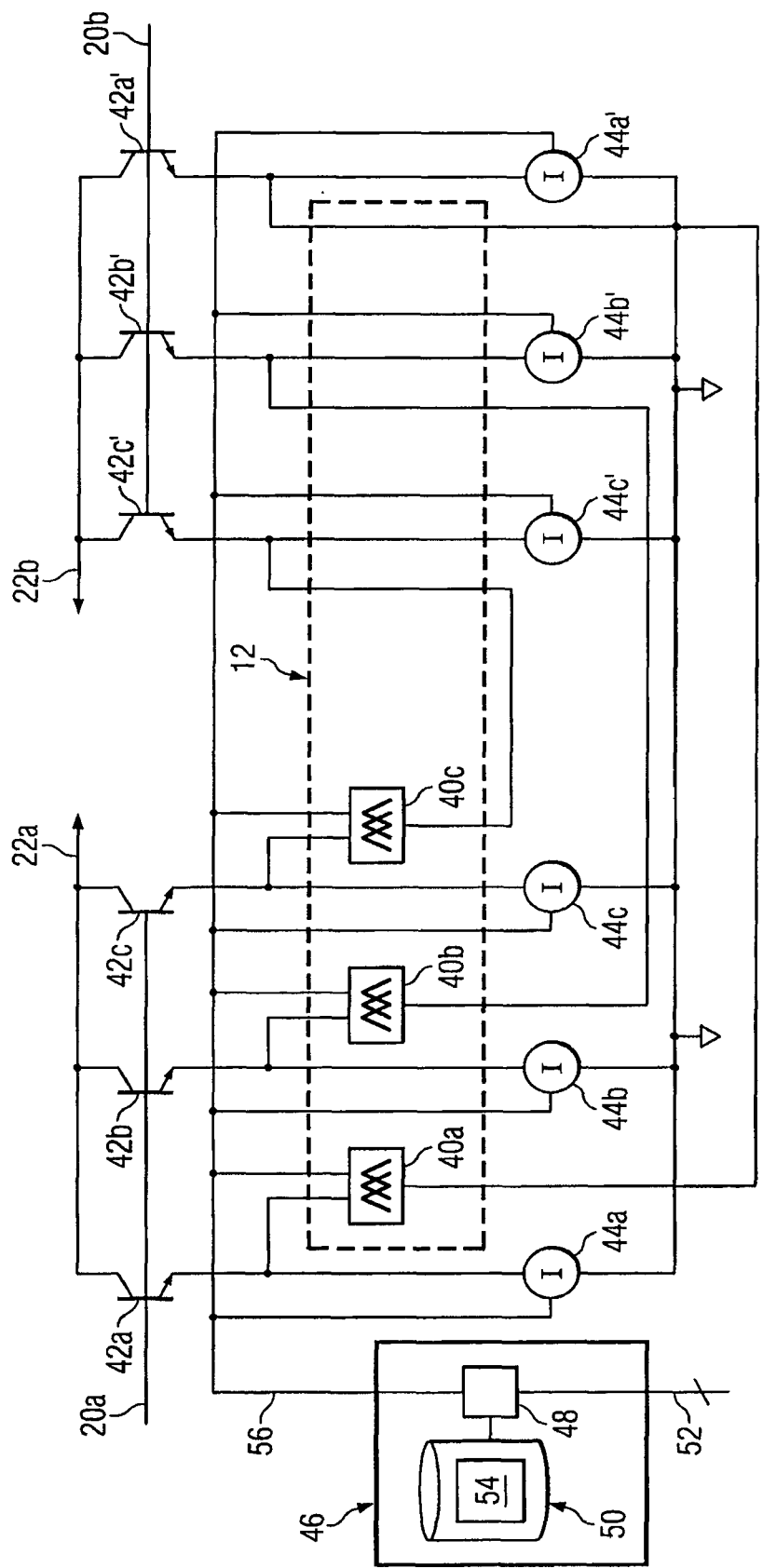
FIG. 5 illustrates a differential embodiment of the filter depicted in FIG. 1.

FIG. 5 illustrates a differential embodiment of circuit 10 in which filter 12 is integrated with an input stage of tuner 14 on integrated circuit 16. In this embodiment, each stage 40 is coupled to an appropriate transistor 42 and input source 44 as well as coupled to a mirror transistor 42' and mirror input source 44'. For example, stage 40a is coupled to transistors 42a and 42a' and input sources 44a and 44a'. Stage 40b is coupled to transistors 42b and 42b' and input sources 44b and 44b'. Stage 40c is coupled to transistors 42c and 42c' and input sources 44c and 44c'. Moreover, the differential embodiment of circuit 10 receives a differential input signal 20 comprising input signal components 20a and 20b, and generates a differential intermediate output signal 22 comprising intermediate output signal components 22a and 22b.

Figure 6A:
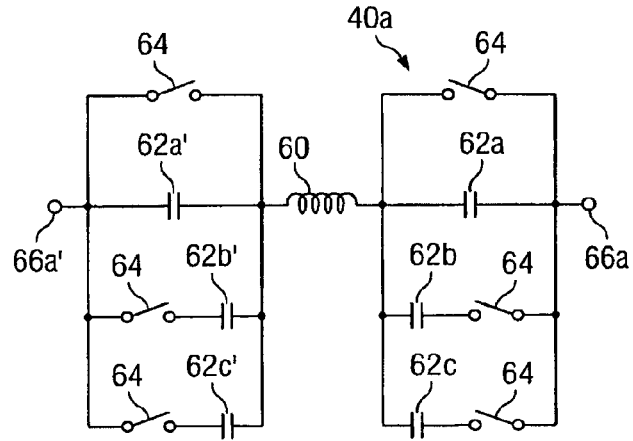
FIGS. 6A-6C illustrate differential embodiments of stages of the filter depicted in FIG. 5.
Figure 6B:
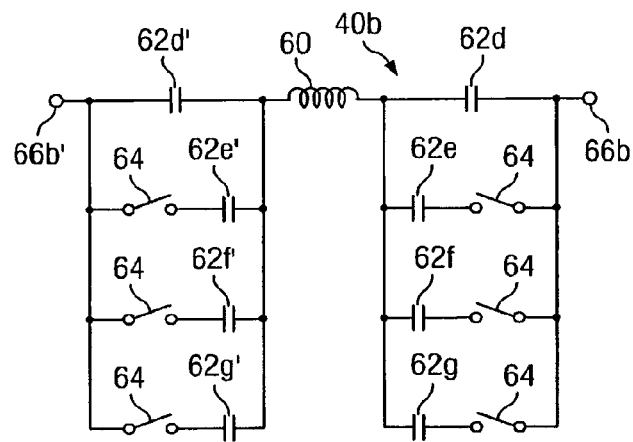
Figure 6C:
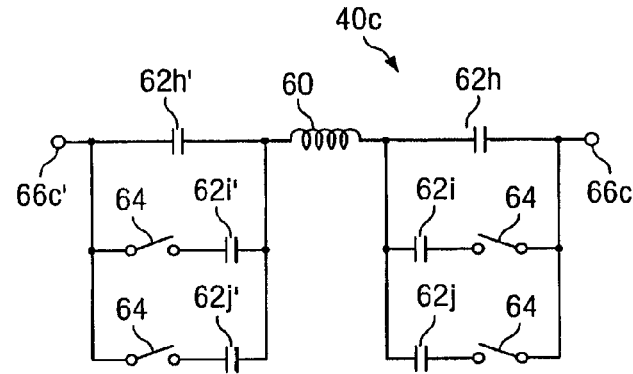

FIGS. 6A-6C illustrate differential embodiments of stages 40a-40c of FIG. 5. Referring to FIG. 6A, stage 40a comprises inductor 60 coupled to capacitors 62a and 62a' in series. Capacitor 62a is further coupled to terminal 66a and capacitor 62a' is further coupled to terminal 66b. Capacitors 62b and 62c are switchably coupled in parallel to capacitor 62a. Capacitors 62b' and 62c' are switchably coupled in parallel to capacitor 62a'. Terminal 66a is coupled to the emitter of transistor 42a'. Terminal 66b is coupled to the emitter of transistor 42a. Switches 64 are selectively enabled based upon command signal 56 generated by controller 46.

Referring to FIG. 6B, stage 40b comprises an inductor 60 coupled to capacitors 62d and 62d'. Capacitors 62e, 62f, and 62g are switchably coupled in parallel to capacitor 62d. Capacitors 62e', 62f, and 62g' are switchably coupled in parallel to capacitor 62d'. Capacitor 62d is further coupled to terminal 66b which is coupled to the emitter of transistor 42b'. Capacitor 62d' is further coupled to terminal 66b' which is coupled to the emitter of transistor 42b. Switches 64 are selectively enabled based upon command signal 56 generated by controller 46.

Referring to FIG. 6C, stage 40c comprises an inductor 60 coupled to capacitors 62h and 62h'. Capacitors 62i and 62j are switchably coupled in parallel to capacitor 62h. Capacitors 62i' and 62j' are switchably coupled in parallel to capacitor 62h'. Capacitor 62h is further coupled to terminal 66c which is coupled to the emitter of transistor 42c'. Capacitor 62W is further coupled to terminal 66c' which is coupled to the emitter of transistor 42c. Switches 64 are selectively enabled based upon command signal 56 generated by controller 46.

In general, the values of capacitors 62a'-62j' are the same as the values of the appropriate corresponding capacitors 62a-62j.

Although the present invention has been described in detail, it should be understood that various changes, substitutions and alterations can be made hereto without departing from the sphere and scope of the invention as defined by the appended claims.

To aid the Patent Office, and any readers of any patent issued on this application in interpreting the claims appended hereto, applicants wish to note that they do not intend any of the appended claims to invoke §6 of 35 U.S.C. §112 as it exists on the date of filing hereof unless "means for" or "step for" are used in the particular claim.

What is claimed is:

1. A filter comprising:
    an inductor;
    a first capacitor having a first lead and a second lead, wherein the first lead of the first capacitor is coupled to a lead of the inductor; and
    a plurality of capacitors, each of the capacitors having a first lead coupled to the first lead of the first capacitor and a second lead switchably coupled to the second lead of the first capacitor, wherein said filter is configured to receive an input signal comprising a first number of channels and to communicate an intermediate output signal comprising a second number of channels which is less than the first number of channels.

2. The filter of claim 1, wherein the filter is formed on an integrated circuit.

3. The filter of claim 1, wherein:
the first number of channels comprises a plurality of bands of channels; and the filter is switchable among a plurality of stages to communicate the intermediate output signal comprising a selected one of the plurality of bands of channels.

4. The filter of claim 1, wherein:
the first number of channels comprises a plurality of bands of channels; and at least one stage of the filter is switchable among the plurality of capacitors to communicate the intermediate output signal comprising a selected one of the plurality of bands of channels.

5. The filter of claim 1, wherein the input signal comprises a radio frequency signal ranging from 48 MHz to 852 MHz.

6. The filter of claim 1, wherein the input signal comprises a differential signal, and the intermediate output signal comprises a differential signal.

7. A method for filtering an input signal, comprising:
receiving an input signal comprising a plurality of bands of channels;
switching among a plurality of stages of a filter to communicate an intermediate output signal comprising a selected one of the plurality of bands of channels, wherein the filter is formed on an integrated circuit;
receiving the intermediate output signal; and
communicating an output signal comprising a subset of the channels from the selected band of channels
wherein the input signal comprises a first number of channels, the intermediate output signal comprises a second number of channels less than the first number of channels, and the output signal comprises a third number of channels less than the second number of channels.

8. The method of claim 7, wherein switching further comprises:
switching among a plurality of capacitors associated with a particular one of the plurality of stages.

9. The method of claim 7, wherein receiving the intermediate output signal and communicating the output signal are performed at least in part by a tuner and at least a portion of the tuner is formed on the integrated circuit.

10. The method of claim 7, wherein the filter comprises an input stage of the tuner.

11. The method of claim 7, wherein:
the first number of channels is greater than one-hundred;
the second number of channels is less than forty; and
the third number of channels is less than three.

12. The method of claim 7, wherein the input signal comprises a radio frequency signal ranging from 48 MHz to 852 MHz.

13. A method for filtering an input signal, comprising:
receiving an input signal comprising a plurality of bands of channels;
switching among a plurality of stages of a filter to communicate an intermediate output signal comprising a selected one of the plurality of bands of channels, wherein the filter is formed on an integrated circuit;
receiving the intermediate output signal; and
communicating an output signal comprising a subset of the channels from the selected band of channels,
wherein the input signal comprises a differential signal, and the intermediate output signal comprises a differential signal.

* * * * *

UNITED STATES PATENT AND TRADEMARK OFFICE
CERTIFICATE OF CORRECTION

PATENT NO. : 8,704,615 B2
APPLICATION NO. : 12/983781
DATED : April 22, 2014
INVENTOR(S) : Nathan R. Belk Page 1 of 1

It is certified that error appears in the above-identified patent and that said Letters Patent is hereby corrected as shown below:

In the Specification

At column 8, line number 39, delete "62W" an replace with --62h'--.

In the Claims

At column 9, claim number 7, line number 34, delete "channels" and replace with --channels,--.

Signed and Sealed this
Eighth Day of July, 2014

Michelle K. Lee
*Deputy Director of the United States Patent and Trademark Office*